United States Patent
Blalock et al.

(10) Patent No.: US 6,400,029 B1
(45) Date of Patent: Jun. 4, 2002

(54) SELF-LIMITING METHOD OF REDUCING CONTAMINATION IN A CONTACT OPENING, METHOD OF MAKING CONTACTS AND SEMICONDUCTOR DEVICES THEREWITH, AND RESULTING STRUCTURES

(75) Inventors: Guy T. Blalock; Bradley J. Howard, both of Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/372,326

(22) Filed: Aug. 11, 1999

Related U.S. Application Data

(62) Division of application No. 09/082,138, filed on May 20, 1998, now Pat. No. 6,232,219.

(51) Int. Cl.[7] .................. H01L 23/48; H01L 23/52; H01L 29/40; H01L 29/76; H01L 31/062
(52) U.S. Cl. .................. 257/774; 257/377; 257/382
(58) Field of Search ................. 257/773, 774, 257/739, 758, 377, 382, 383, 690; 438/710, 725, 714, 719, 734, 637, 620, 618, 589, 597

(56) References Cited

U.S. PATENT DOCUMENTS

| | | | |
|---|---|---|---|
| 3,983,264 A | 9/1976 | Schroen et al. | 257/734 |
| 4,208,241 A | 6/1980 | Harshbarger et al. | 216/67 |
| 4,764,480 A | 8/1988 | Vora | 438/203 |
| 5,427,638 A | 6/1995 | Goetz et al. | 156/153 |
| 5,429,710 A * | 7/1995 | Akiba et al. | 216/17 |
| 5,468,342 A | 11/1995 | Nukty et al. | 438/714 |
| 5,486,235 A | 1/1996 | Ye et al. | 134/1.1 |
| 5,542,171 A | 8/1996 | Juskey et al. | 29/840 |
| 5,587,039 A | 12/1996 | Salimian et al. | 156/345 |
| 5,599,742 A | 2/1997 | Kadomura | 438/637 |
| 5,661,083 A | 8/1997 | Chen et al. | 438/637 |
| 5,681,780 A * | 10/1997 | Mihara et al. | 438/700 |
| 5,762,813 A | 6/1998 | Takiyama et al. | 216/67 |
| 5,858,878 A | 1/1999 | Toda | 438/9 |
| 5,900,163 A | 5/1999 | Yi et al. | 216/79 |
| 6,020,254 A * | 2/2000 | Taguwa | 438/618 |

* cited by examiner

Primary Examiner—Steven Loke
Assistant Examiner—Shouxiang Hu
(74) Attorney, Agent, or Firm—TraskBritt

(57) ABSTRACT

A method of forming a contact opening including removing a residual carbon/halide layer which may form in the contact opening during the etching of the dielectric layer, or which may be intentionally deposited in the contact opening, wherein the removal of the carbon/halide layer also advantageously removes an adjacent portion of the active-device region of the semiconductor substrate which has become damaged or dopant depleted during the fabrication process. The removal of the carbon/halide layer is effected by a directional, energetic ion bombardment to activate the halides in the carbon/halide layer which, in turn, removes both the carbon/halide layer and a portion of the active-device region in a substantially anisotropic manner. The method of present invention is self-limiting because, once the halides within the carbon/halide layer are activated and thereby depleted, the removal of material in the adjacent active-device region ceases.

16 Claims, 9 Drawing Sheets

SELF-LIMITING METHOD OF REDUCING CONTAMINATION IN A CONTACT OPENING, METHOD OF MAKING CONTACTS AND SEMICONDUCTOR DEVICES THEREWITH, AND RESULTING STRUCTURES

CROSS REFERENCE TO RELATED APPLICATION

This application is a divisional of application Ser. No. 09/082,138, filed May 20, 1998. now U.S. Pat. No. 6,232,219.

BACKGROUND OF THE INVENTION

1. Field of the Invention

The present invention relates to formation of a contact opening in a dielectric layer to expose an active-device region of a semiconductor substrate. More particularly, the present invention relates to a method of removing a residual carbon/halide layer which forms in the contact opening during the etching of the dielectric layer or is intentionally deposited in the contact opening, wherein the removal of the carbon/halide layer also advantageously removes a damaged and/or dopant-depleted portion of the active-device region of the semiconductor substrate to expose a more highly-doped portion of the substrate upon which to form a contact.

2. State of the Art

In the processing of integrated circuits, electrical contact must be made to isolated active-device regions formed within a semiconductor substrate, such as a silicon wafer. Such active-device regions may include p-type and n-type source and drain regions used in the production of NMOS, PMOS, and CMOS structures for production of DRAM chips and the like. The active-device regions are connected by conductive paths or lines which are fabricated above an insulative or dielectric material covering a surface of the semiconductor substrate. To provide electrical connection between the conductive path and the active-device regions, openings in the insulative material are generally provided to enable a conductive material to contact the desired regions, thereby forming a "contact." The openings in the insulative material are typically referred to as "contact openings."

Higher performance, lower cost, increased miniaturization of components, and greater packaging density of integrated circuits are ongoing goals of the computer industry. The advantages of increased miniaturization of components include: reduced-bulk electronic equipment, improved reliability by reducing the number of solder or plug connections, lower assembly and packaging costs, and improved circuit performance. In pursuit of increased miniaturization, semiconductor components have been continually redesigned to achieve ever higher degrees of integration which has reduced their size. However, as components become smaller and smaller, tolerances for all semiconductor structures (such as circuitry traces, contact openings, and the like) become more and more stringent. Moreover, the reduction in contact size (i.e., diameter) has resulted in a small area of contact between the active-device regions and the conductive material of the contact. Regardless of the conductive material used to fill these small contact openings to form the contacts (such as tungsten, aluminum, or the like), the size reduction of the contact openings will demand effective removal of contaminants from the bottom of the contact opening to achieve efficient contact between the semiconductor substrate and the conductive material used to fill the contact opening.

By way of example, a widely-utilized DRAM (Dynamic Random Access Memory) manufacturing process utilizes CMOS (Complimentary Metal Oxide Semiconductor) technology to produce DRAM circuits which comprise an array of unit memory cells, each including one capacitor and one transistor, such as a field effect transistor ("FET"). A typical method for forming a contact opening for a CMOS FET is illustrated in FIGS. 7–11. It should be understood that the figures presented in conjunction with this description are not meant to be actual cross-sectional views of any particular portion of an actual semiconducting device, but are merely idealized representations which are employed to more clearly and fully depict the process of the invention than would otherwise be possible.

FIG. 7 illustrates an intermediate structure 200 in the production of a memory cell. This intermediate structure 200 comprises a semiconductor substrate 202, such as a lightly doped P-type silicon substrate, which has been oxidized to form thick field oxide areas 204 and exposed to dopant implantation processes to form active device regions, such as drain regions 206 adjacent the field oxide areas 204 and source regions 208 between the drain regions 206. Transistor gate members 212 are formed on the surface of the semiconductor substrate 202, including the gate members 212 residing on a substrate active area 210 spanned between the drain regions and the source regions. The transistor gate members 212 each comprise a lower buffer layer 214 separating a gate conducting layer or word line 216 of the transistor gate member 212 from the semiconductor substrate 202. Transistor insulating spacer members 218 are formed on either side of each transistor gate member 212 and a cap insulator 222 is formed on the top of each transistor gate member 212. A dielectric layer 224 is disposed over the semiconductor substrate 202, the thick field oxide areas 204, and the transistor gate members 212.

As shown in FIG. 8, a photoresist mask layer 226 is patterned on the dielectric layer 224, such that openings 228 (one illustrated) in the photoresist mask layer 226 is positioned over the source region 208 of the semiconductor substrate 202. The photoresist mask opening 228 is positioned over the source region for the formation of a contact opening for a bit line and positioned over the drain region for the formation of a contact opening for a capacitor. The materials used for the photoresist mask layer 226 are generally novolac resin photoresists, but may include halide-containing polymers, such as poly-trifluoroethyl chloroacrylate. Halides are compounds including at least one halogen element such as fluorine, chlorine, bromine, iodine, and astatine.

A contact opening 232 is etched through the opening 228 in the photoresist mask layer 226, as shown in FIG. 9. The etching may be performed by any known technique. However, a dry etch, such as plasma etching and reactive ion etching, is generally used for high aspect ratio etches in dielectric materials, such as silicon dioxide. Etchants used for forming the contact openings 232 also contain halide compounds, such as $CF_4$, $CHF_3$, $C_2F_6$, $CH_2F_2$, $NF_3$, or other freons and mixtures thereof, in combination with a carrier gas, such as Ar, He, Ne, Kr, $O_2$, $N_2$, or a mixture thereof.

As a result of the etching process, a carbon/halide residue 234, usually a fluorocarbon residue, forms in the contact opening 232, as shown in FIG. 10. This carbon/halide residue 234 remains even after the photoresist mask layer 226 has been stripped away. The carbon/halide residue 234 is subsequently removed, usually with a plasma ashing technique using oxygen gas or oxygen gas with a halogen-containing gas, such as carbon tetrafluoride, as shown in FIG. 11. Although the plasma ashing and similar techniques efficiently remove the carbon/halide residue 234, the exposed portion 236 of the source region 208 proximate the contact opening 232 is usually reduced or depleted of dopant by the prior fabrication steps, such as dopant diffusing out of the source region 208 during thermal processing steps. The depletion of dopant results in the source region 208 being less conductive which, of course, reduces the efficiency of any subsequently formed contact.

Therefore, it would be desirable to develop a method for removing the carbon/halide residue from the contact openings while also removing a portion of the dopant-depleted active-device region in order to access more highly-doped, underlying portions of the active-device region for a more efficient contact.

SUMMARY OF THE INVENTION

The present invention relates to a method of forming a contact opening including removing a residual carbon/halide layer which forms in the contact opening during the etching of the dielectric layer, or which is intentionally deposited in the contact opening as part of one embodiment of the method of the invention, wherein the removal of the carbon/halide layer also advantageously removes a dopant-depleted portion of the active-device region of the semiconductor substrate to expose a more highly-doped portion of the substrate upon which to form a contact. The removal of the carbon/halide layer is effected by a directional, energetic ion bombardment, preferably an oxygen ion bombardment. The ion bombardment activates the halides in the carbon/halide layer which, in turn, removes both the carbon/halide layer and a portion of the active-device region in a substantially anisotropic manner. The removal of the portion of the active-device region is advantageous because the active-device region proximate the contact opening is generally damaged due to the etching of the contact opening and/or depleted of conductivity-imparting dopant due to fabrication steps, such as dopant diffusion during thermal processing steps. Thus, the removal of the portion of the active-device region exposes an undamaged portion of the active-device region which is higher in dopant concentration (i.e., more conductive) than the portion removed.

The method of the present invention is also self-limiting, because once the halides within the carbon/halide layer are activated and thereby depleted, the removal of the adjacent dopant-depleted portion of the active-device region ceases.

It has been found that the thickness of the halide-containing material layer which is substantially simultaneously activated by the ion bombardment is directly proportional to the ion energy. Further, it has been found that the depth to which the portion of the active-device region is removed is directly proportional to the thickness of the adjacent halide-containing material layer which is substantially simultaneously activated. Therefore, by controlling the ion energy of the ion bombardment, one can control the depth of the portion of the active-device region which is removed.

After the removal of the dopant-depleted portion of the active-device region, the contact is completed by depositing a conductive material within the contact opening.

BRIEF DESCRIPTION OF THE SEVERAL VIEWS OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE INVENTION

Figure 1:
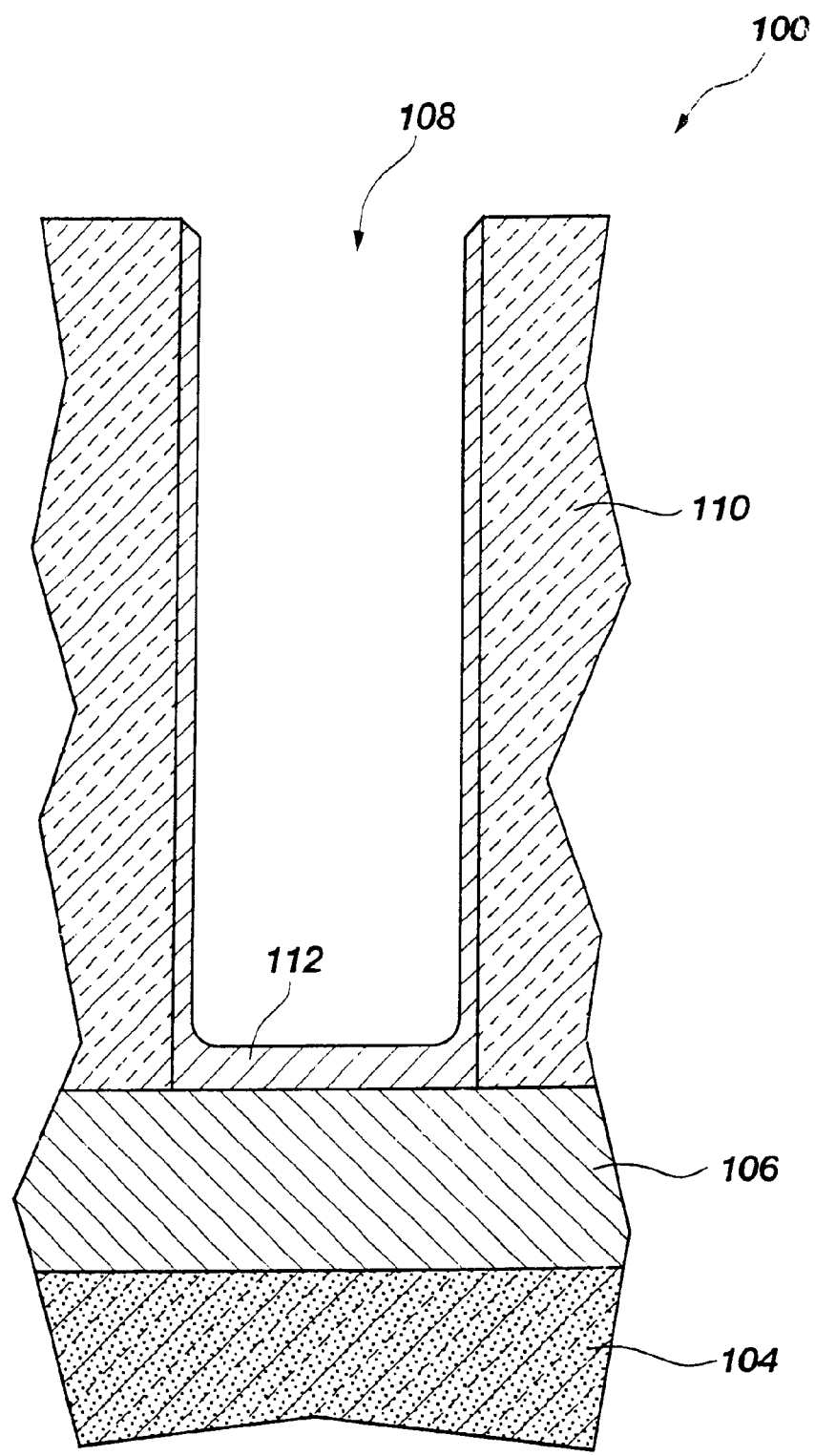
FIGS. 1–3 are side cross-sectional views of a method of the present invention for removing a carbon/halide layer and a portion of an active-device region from a contact opening.
Figure 2:
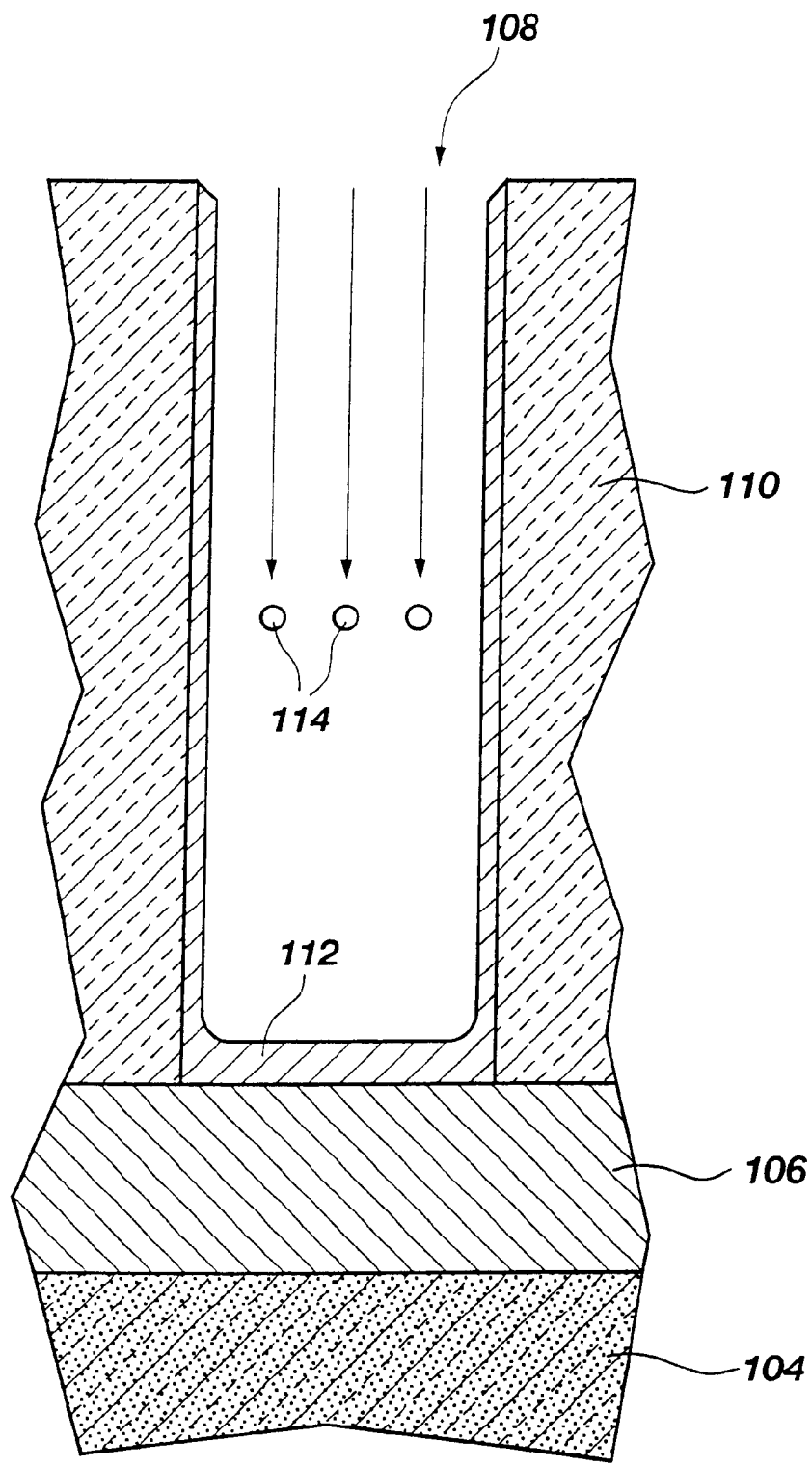
Figure 3:
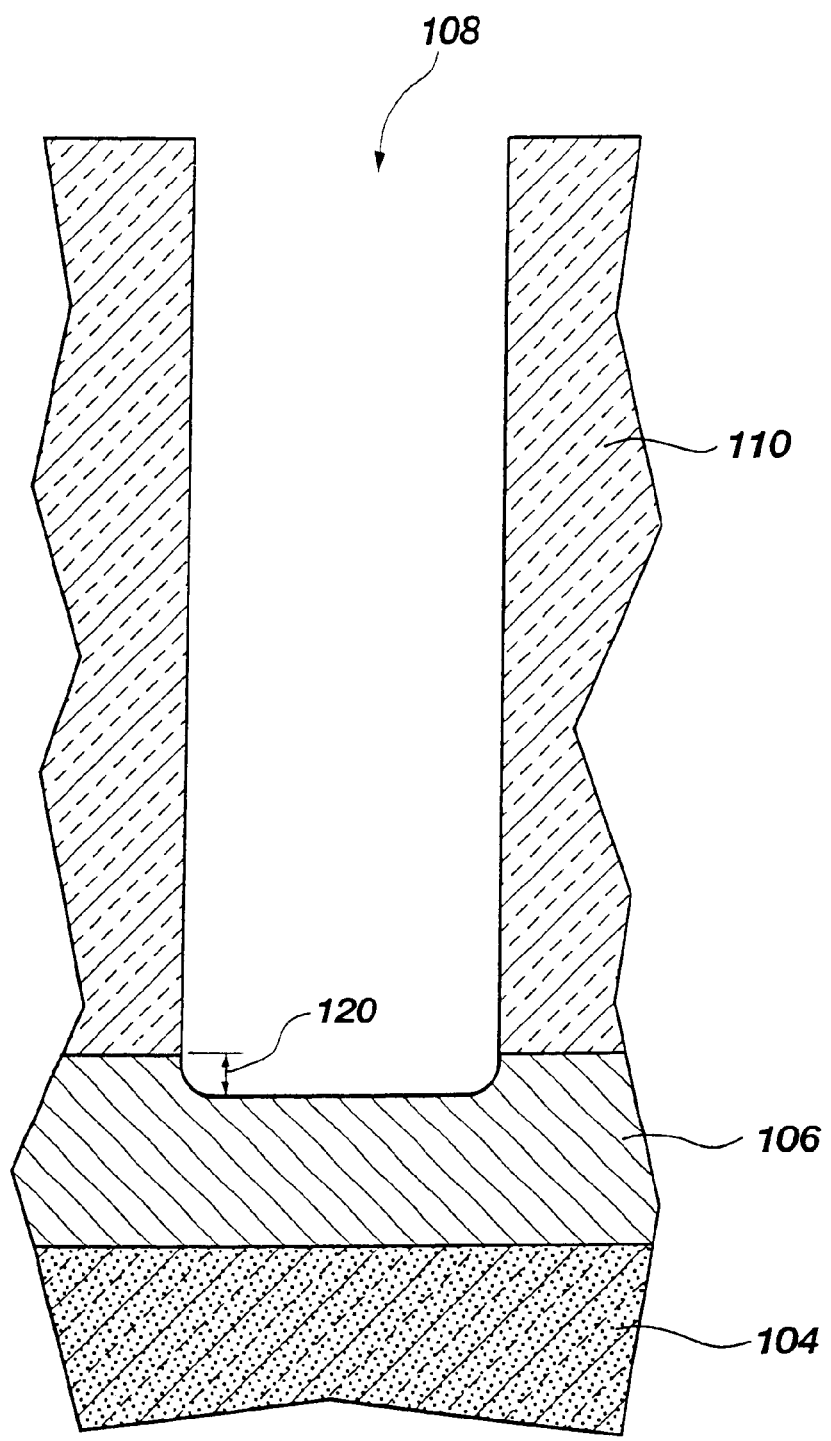

FIGS. 1–3 illustrate a method according to the present invention for forming a contact opening, including removing a halide-containing layer from said contact opening and removing a portion of an active-device region adjacent the halide-containing layer from a semiconductor substrate.

Figure 8:
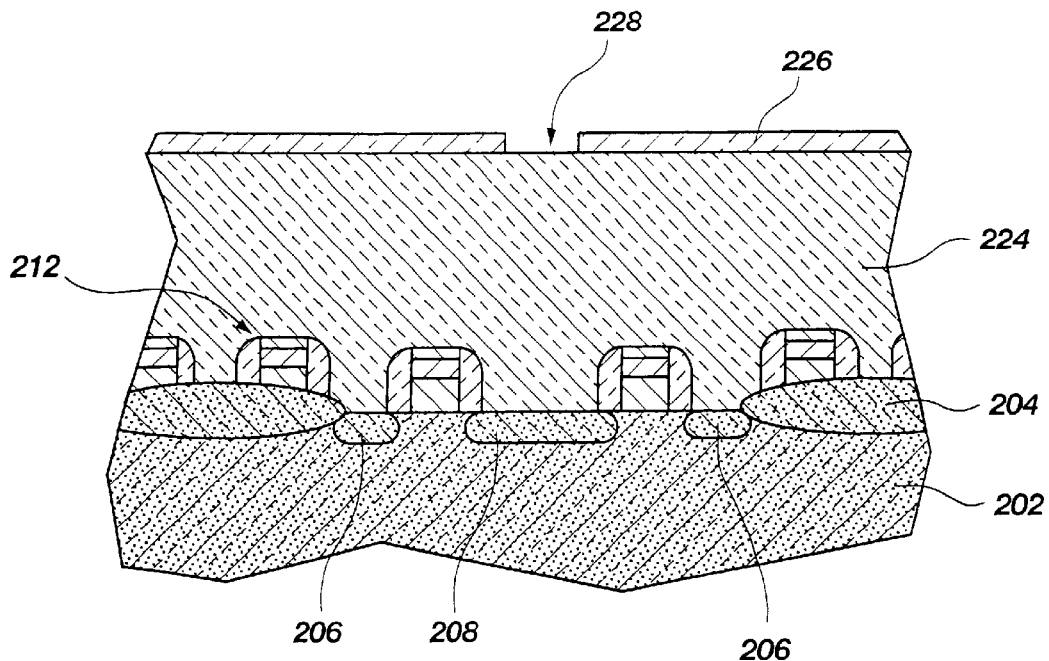
Figure 9:
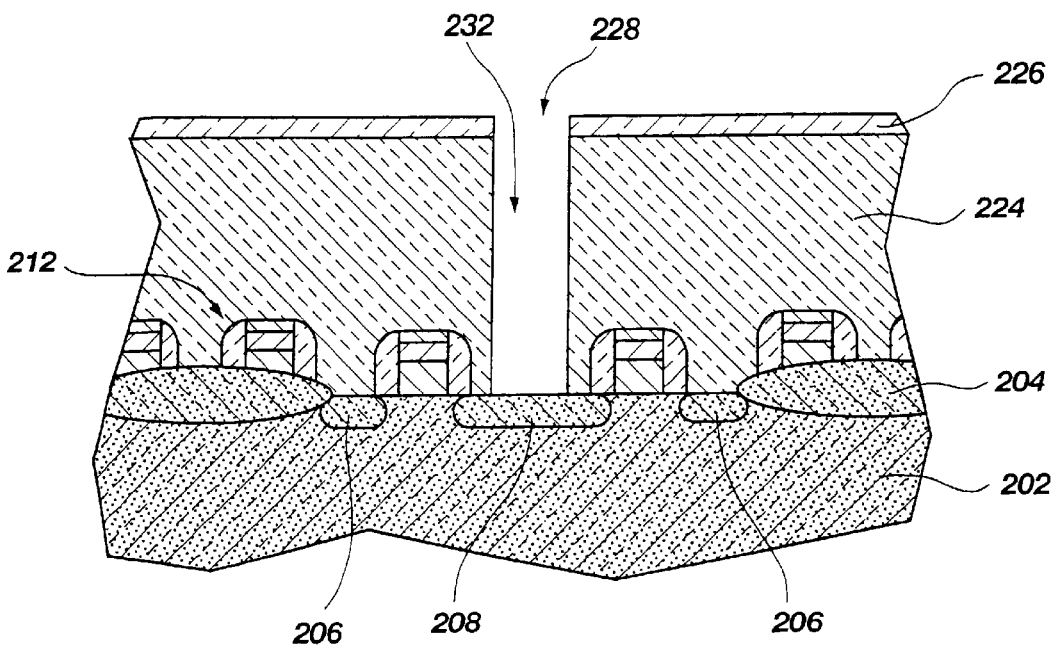
Figure 10:
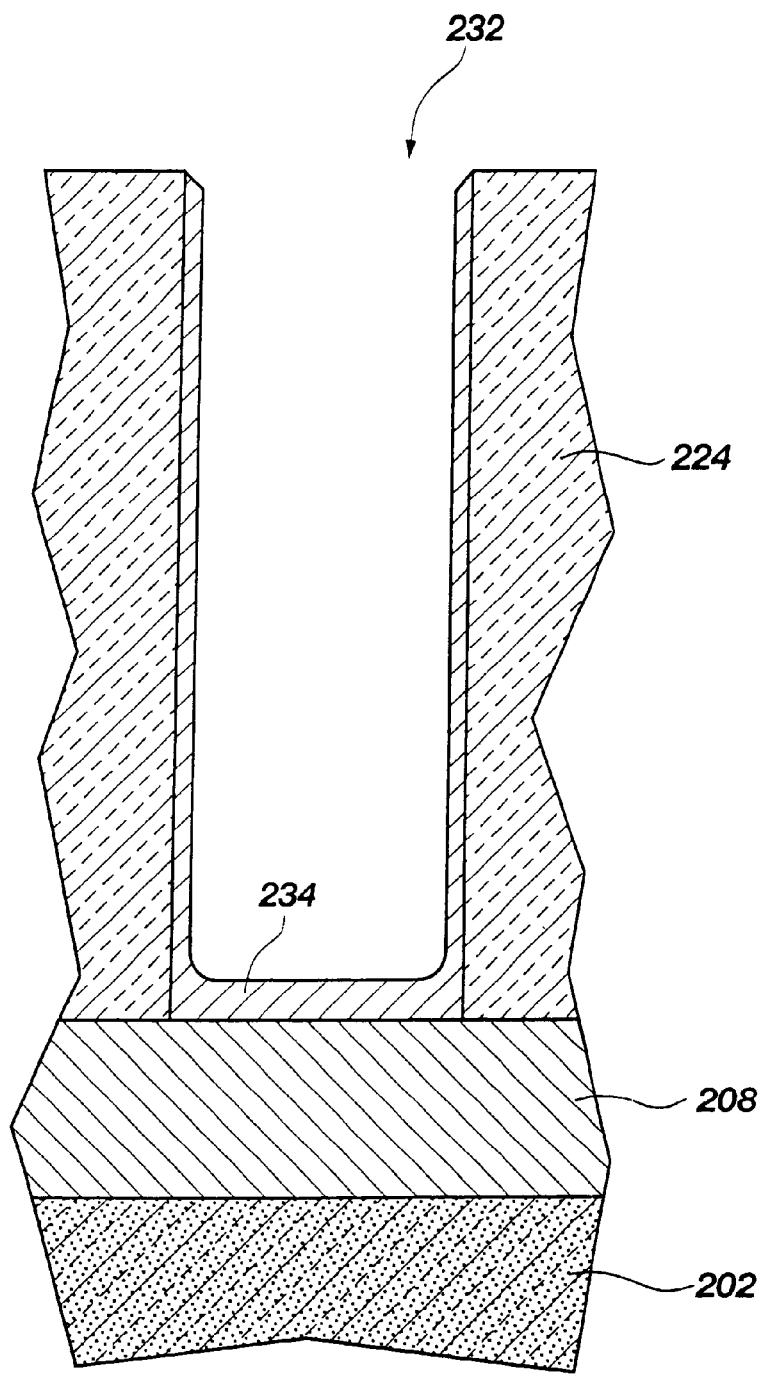
Figure 11:
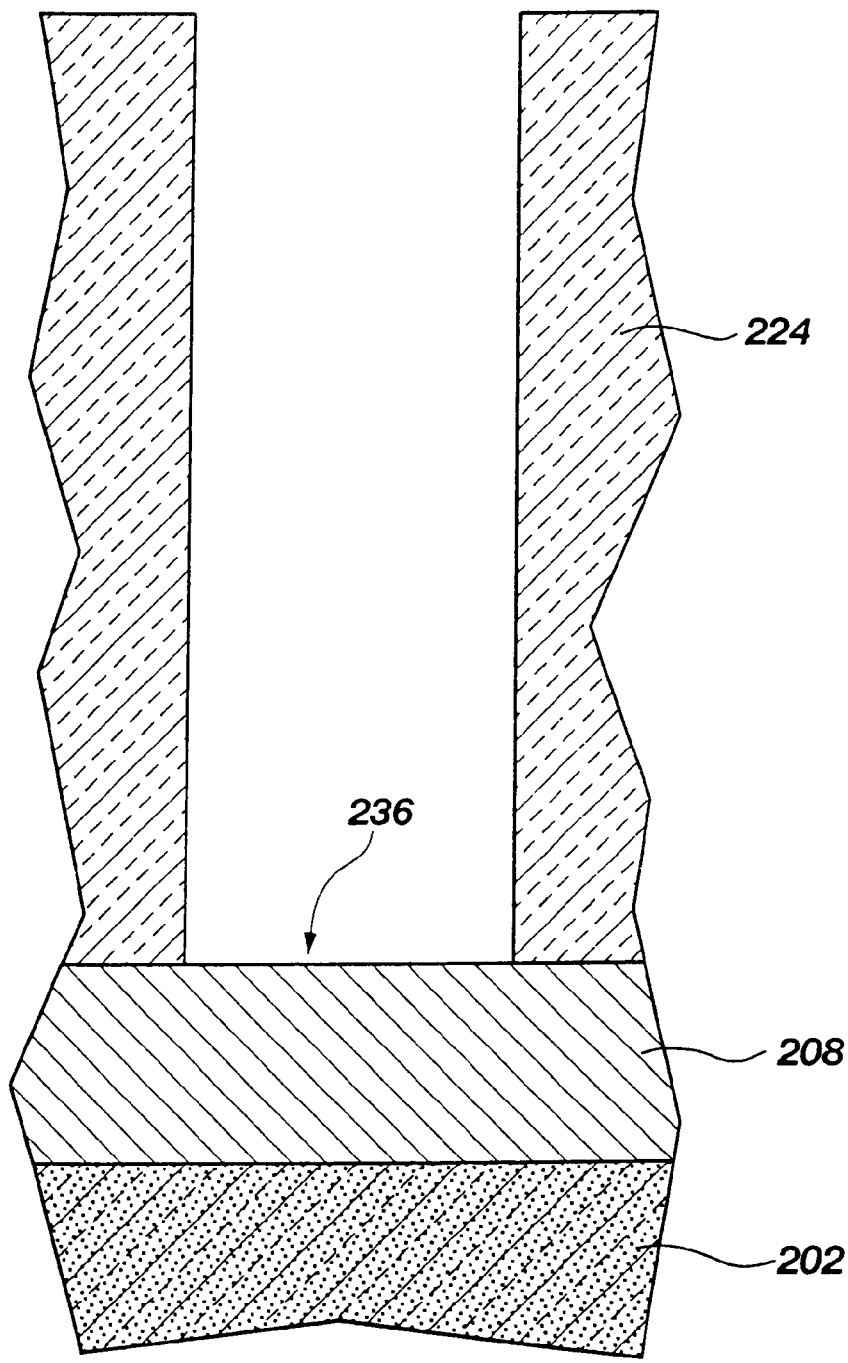

FIG. 1 illustrates a contact opening 108 in an intermediate structure 100 in the production of a semiconductor device (similar to FIG. 8) directly after the etching thereof. This intermediate structure 100 comprises a semiconductor substrate 104, preferably a silicon substrate, which has been exposed to dopant implantation processes to form an active-device region 106, such as a source or drain region on an MOS structure. A contact opening 108 extends through a dielectric layer 110, such as silicon dioxide or silicon nitride, which is disposed over the semiconductor substrate 104. The contact opening 108 is coated with a halide-containing material layer 112, either a continuous layer or a discontinuous layer. The presence of the halide-containing material layer 112 may be a natural consequence of the etching of the contact opening 108 when a halide-containing polymer material is used as a photoresist mask (as discussed above), or the halide-containing material layer 112 may be deposited in the contact opening 108, by any known deposition technique, such as chemical vapor deposition and plasma enhanced chemical vapor deposition, to take advantage of benefits of the ion bombardment technique of the present invention.

FIG. 2 illustrates an oxygen clean process performed in an environment of directional, energetic ion bombardment 114 (i.e., oxygen ions). The ion bombardment 114 activates the halide in the halide-containing material layer 112. This activation of the halide removes both the halide-containing material layer 112 and a portion of the adjacent, underlying active-device region 106 in a substantially anisotropic manner, as shown in FIG. 3. The removal of the noted portion of the active-device region 106 is advantageous because the active-device region 106 proximate the contact opening 108 is generally depleted of conductivity-imparting dopant. Thus, the removal of the portion of the active-device region 106 adjacent halide-containing material layer 112 exposes a portion of the active-device region 106 which is higher in dopant concentration (i.e., more conductive) than the portion removed.

According to one embodiment of the present invention, the ion bombardment is achieved in a low pressure oxide etch system at a pressure of 120 mTorr, a magnetic flux density of 100 Gauss (the generation of a magnetic field assists in the formation of the plasma field for the ion bombardment), and a gas mixture including about 40 sccm of oxygen gas and about 40 sccm of nitrogen gas. However, the ion bombardment can be performed with a variety of etchants (such as Ar, Xe, and the like) or with other types of known etching techniques, so long as the halides within the halide-containing material layer 112 are activated.

Of particular note, the method of present invention is self-limiting. Once the halides within the halide-containing material layer 112 are activated by the ion bombardment and thereby depleted, the removal of the portion of the active-device region 106 ceases. Further, the method does not etch silicon isotropically. Additionally, it has been found that the thickness of the halide-containing material layer 112, which may be substantially simultaneously activated by the ion bombardment, is directly proportional to the ion energy. Furthermore, it has been found that the depth to which the active-device region 106 is removed is directly proportional to the thickness of the halide-containing material layer 112 which may be substantially simultaneously activated (i.e., the thicker the halide-containing material layer 112, the deeper the removal of the active-device region 106). Therefore, by controlling the ion energy of the ion bombardment and/or thickness or depth of the halide-containing material layer 112, one can control the depth of the portion of the active-device region 106 which is removed. Moreover, since the halide-containing material layer 112 is substantially uniform in thickness or depth across the active-device region 106 exposed at the bottom of the contact opening 108, the removal of the portion of the active-device region 106 will also be uniform.

Figure 4:
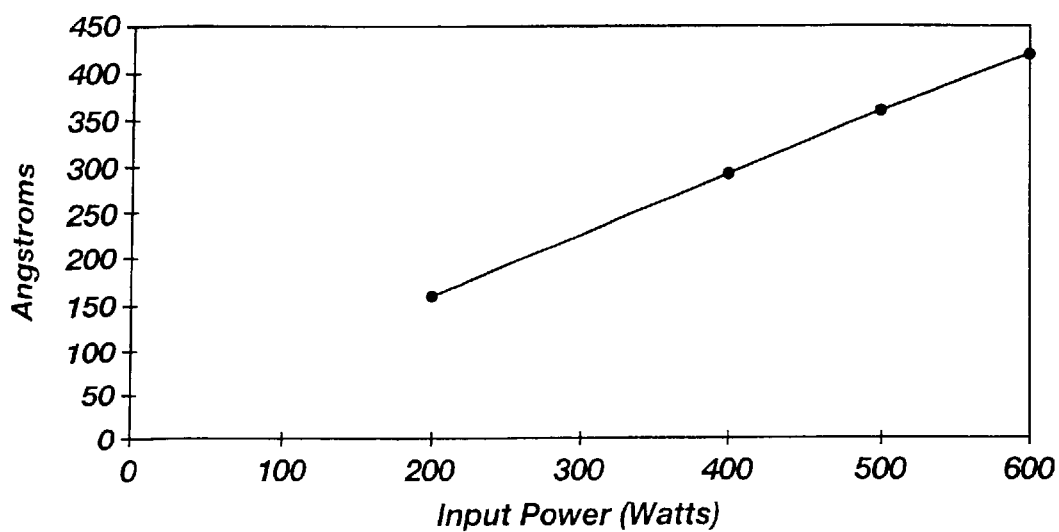
FIG. 4 is a graph of the depth of active-device region removal versus power input to an ion bombardment system of an embodiment of the present invention.

FIG. 4 is a graph illustrating the relationship between the power supplied to an AME 5000 LPV Oxide Etch System (made by Applied Materials and Technology, Inc., Santa Clara, Calif.) and the depth of the removal of the portion of the active-device region 106 (i.e., silicon consumption). The ion bombardment was performed in the AME 5000 Oxide Etcher at a pressure of 120 mTorr, a magnetic flux density of 100 Gauss, and a gas mixture including 40 sccm of oxygen gas and 40 sccm of nitrogen gas. The thickness of the carbon/halide layer in the contact openings used to generate the graph of FIG. 4 was between about 200 and 250 angstroms. Thus, it can be seen that the ion energy is directly related to the depth of the removal of the portion of the active-device region.

The removal of between about 100 and 300 angstroms, and preferably about 200 angstroms, of the active-device region 106 has been found to be a sufficient depth to remove the dopant-depleted portion.

The silicon consumption is primarily due to two factors: the amount of reactant available to consume the silicon (directly related to the thickness of the carbon/halide thickness) and the layer of the carbon halide layer that can be activated to consume the silicon (related to the power applied). However, the maximum amount of silicon consumption is approximately two times the thickness of the carbon/halide layer at the bottom of the contact.

By way of example, for a 50 angstrom layer of carbon/halide residue at the above parameters and an input power of about 200 watts, approximately 100 angstroms of silicon at the bottom of the contact opening would be removed, because the removal is limited by the amount of reactant available (sidewall residue would be removed as it normally would be in an ash etching process). If the input power were increased to 600 watts, the amount of silicon removed would still be limited to approximately 100 angstroms, because it is also limited by the amount of reactant available.

By way of a second example, for a 250 angstrom layer of carbon/halide residue at the above parameters and an input power of about 200 watts, the carbon/halide residue would etch away until it was thin enough for the low energy ion bombardment to activate the silicon at the interface of the carbon/halide residue and the silicon. The overall result would be approximately 150 angstroms of silicon removed. If the input power were increased to 600 watts, the carbon/halide residue would still etch away until it was thin enough for the ion bombardment to active the silicon at the interface of the carbon/halide residue and the silicon. However, since the input power is higher, the carbon/halide residue is thicker than with the 200 watt input power when the activation occurs. Thus, there is more reactant available to remove the silicon. The overall result would be approximately 400 angstroms of silicon consumed.

Figure 5:
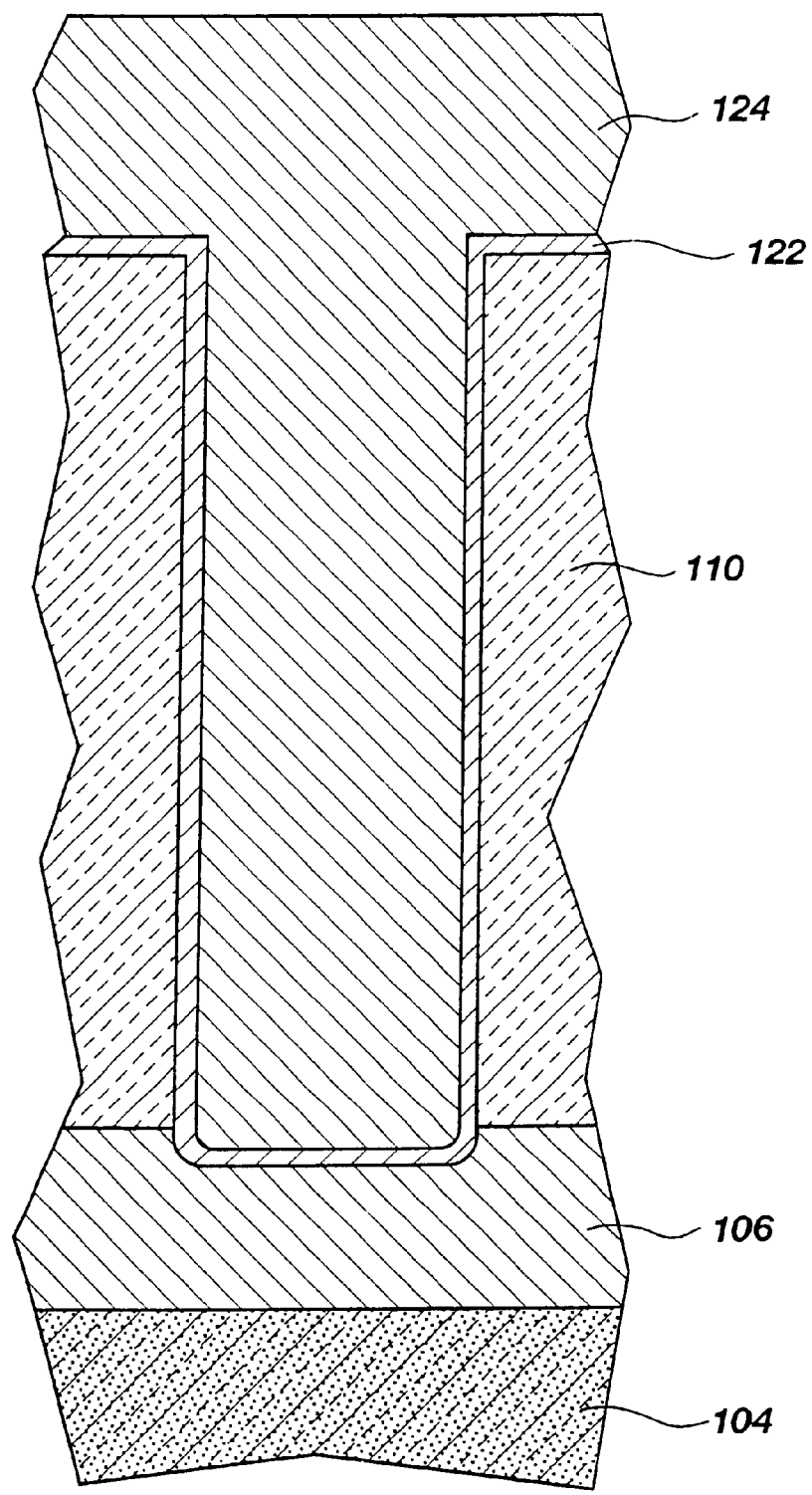
FIG. 5 is a side cross-sectional view of a completed contact according to the present invention.

After the removal of the dopant-depleted portion 120 of the active-device region 106 (as illustrated in FIG. 3), the contact may be completed, as shown in FIG. 5, by depositing a layer of titanium nitride 122 over the dielectric layer 110 and into the contact opening 108, by any known deposition process. The contact opening 108 is then filled with a conductive material 124, such as tungsten, aluminum, or the like, by any known process.

Figure 6:
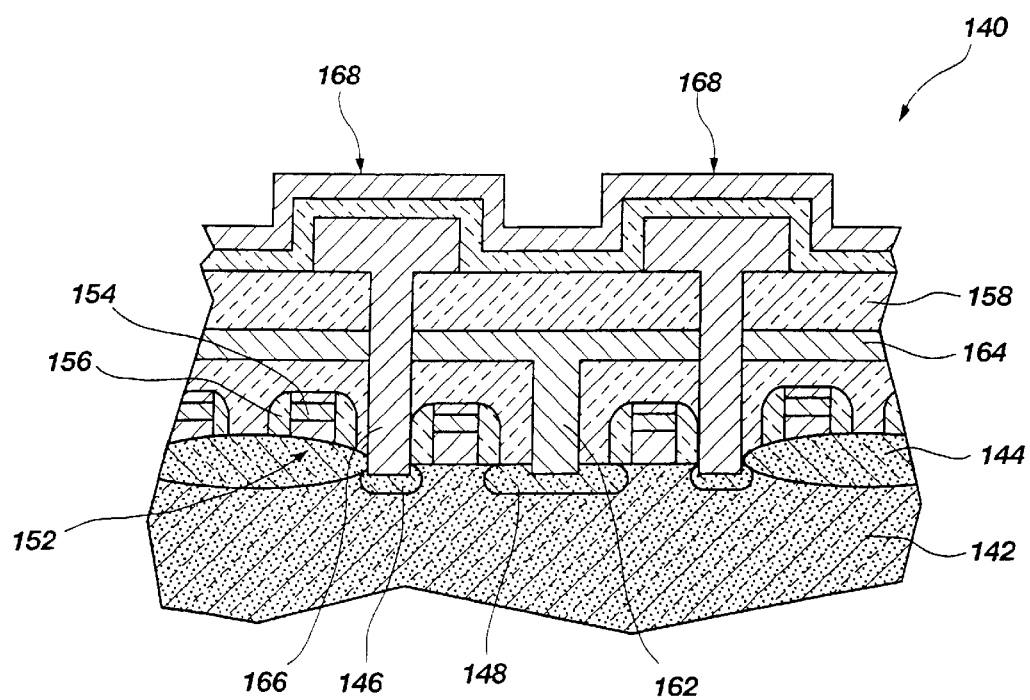
FIG. 6 is a side cross-sectional view of a CMOS structure within a memory array of a DRAM chip utilizing a completed contact of the present invention.
Figure 7:
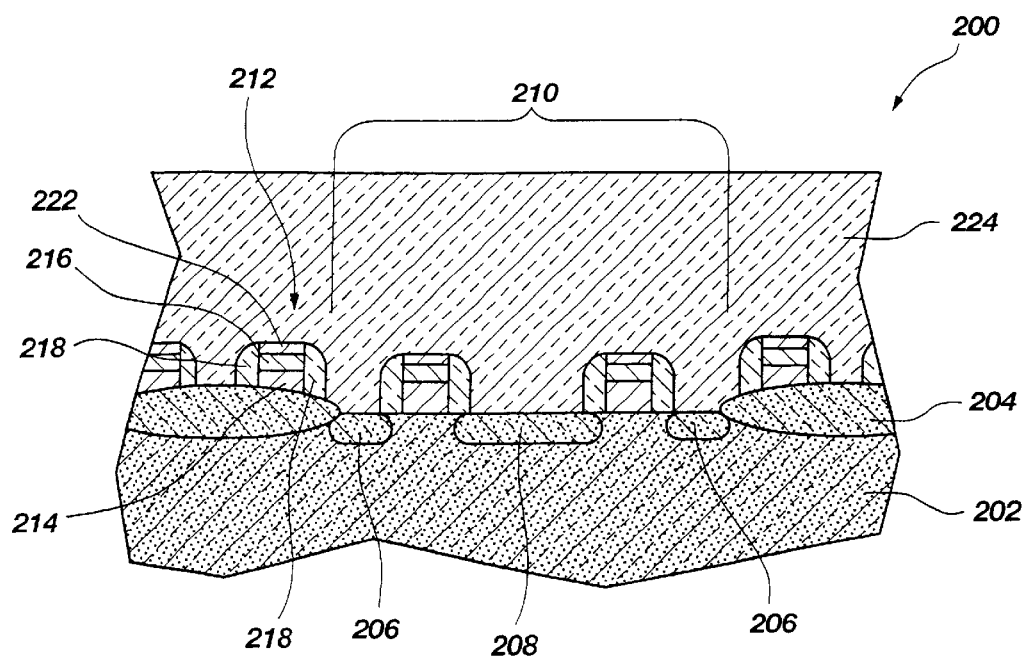
FIGS. 7–11 are side cross-sectional views of a known technique of forming a contact opening for a memory cell.

Furthermore, it is contemplated that the process of the present invention has utility for production of DRAM chips, wherein a previously disadvantageous method of recessing the contact is used in forming the CMOS structures within a memory array of the DRAM chip. An exemplary CMOS structure 140 formed using the method of the present invention is illustrated in FIG. 6, shown as a portion of a memory array in a DRAM chip. The CMOS structure 140 comprises a semiconductor substrate 142, such as a lightly doped P-type silicon substrate, which has been oxidized to form thick field oxide areas 144 and exposed to dopant implantation processes to form drain regions 146 and source regions 148. Transistor gate members 152, including a word line 154 bounded by insulative material 156, are formed on the surface of the semiconductor substrate 142. A barrier layer 158, such as tetraethyl orthosilicate—TEOS, borophosphosilicate glass—BPSG, phosphosilicate glass—PSG, or the like, is disposed over the semiconductor substrate 142, the thick field oxide areas 144, and the transistor gate members 152. Bitline contacts 162 extend through barrier layer 158 to form an electrical contact between the source regions 148 and with a bitline 164 (which extends through the barrier layer 158). Capacitor contacts 166 also extend through the barrier layer 158 to form an electrical communication between the drain regions 146 and capacitors 168, each of the bitline contacts 162 and capacitor contacts 166 having been formed by a conductive material disposed within a contact opening that has been formed by the method of the present invention.

It is, of course, understood that the present invention is not limited to the production of DRAM chips, but can be utilized in numerous semiconductor device fabrication processes in general.

Having thus described in detail preferred embodiments of the present invention, it is to be understood that the invention defined by the appended claims is not to be limited by particular details set forth in the above description as many apparent variations thereof are possible without departing from the spirit or scope thereof.

What is claimed is:

1. A semiconductor assembly comprising:
   a semiconductor substrate having a dielectric layer thereover;
   a doped active-device region in said semiconductor substrate;
   at least one opening extending through said dielectric layer and into said doped active-device region in said semiconductor substrate;
   a halide-containing boundary layer coating exposed surfaces of said at least one opening, said halide-containing boundary being adapted for self-limiting removal of a portion of said doped active region when halides in said halide-containing boundary layer are exposed to ion bombardment, wherein the amount of the removed portion of said doped active region is proportional to a thickness of said halide containing boundary layer at the bottom of said at least one opening.

2. The semiconductor assembly of claim 1, wherein said halide-containing boundary layer comprises at least one element selected from the group of fluorine, chlorine, bromine, iodine, and astatine.

3. The semiconductor assembly of claim 1, wherein said halide-containing boundary layer has a thickness of from about 50 angstroms to about 250 angstroms.

4. The semiconductor assembly of claim 1, wherein said halide-containing boundary layer has a thickness of from about 200 angstroms to about 250 angstroms.

5. The semiconductor assembly of claim 1, wherein said halide-containing boundary layer comprises a continuous layer.

6. The semiconductor assembly of claim 1, wherein said halide-containing boundary layer comprises a discontinuous layer.

7. The semiconductor assembly of claim 1, wherein said semiconductor substrate comprises a silicon substrate.

8. The semiconductor assembly of claim 7, wherein said semiconductor substrate comprises a silicon wafer.

9. A semiconductor assembly comprising:
   a semiconductor substrate having a dielectric layer thereover;
   a doped active-device region in said semiconductor substrate; said doped active-device region having a dopant-depleted portion;
   at least one opening extending through said dielectric layer and into a doped active-device region in said semiconductor substrate; and
   a halide-containing boundary layer coating exposed surfaces of said at least one opening, wherein a residual of said dopant-depleted potion of said doped active-device region is resistant to removal by ion bombardment when halides within said halide-containing boundary are activated and depleted by ion bombardment, and the amount of a removed portion of said dopant depleted portion is proportional to a thickness of said halide containing boundary layer at the bottom of said at least one opening.

10. The semiconductor assembly of claim 9, wherein said halide-containing boundary layer comprises at least one element selected from the group of fluorine, chlorine, bromine, iodine, and astatine.

11. The semiconductor assembly of claim 9, wherein said halide-containing boundary layer has a thickness of from about 50 angstroms to about 250 angstroms.

12. The semiconductor assembly of claim 9, wherein said halide-containing boundary layer has a thickness of from about 200 angstroms to about 250 angstroms.

13. The semiconductor assembly of claim 9, wherein said halide-containing boundary layer comprises a continuous layer.

14. The semiconductor assembly of claim 9, wherein said halide-containing boundary layer comprises a discontinuous layer.

15. The semiconductor assembly of claim 9, wherein said semiconductor substrate comprises a silicon substrate.

16. The semiconductor assembly of claim 15, wherein said semiconductor substrate comprises a silicon substrate.

* * * * *

UNITED STATES PATENT AND TRADEMARK OFFICE
CERTIFICATE OF CORRECTION

PATENT NO.    : 6,400,029 B1
DATED         : June 4, 2002
INVENTOR(S)   : Guy T. Blalock and Bradley J. Howard It is certified that error appears in the above-identified patent and that said Letters Patent is hereby corrected as shown below:

Column 1,
Line 12, change the period after "1998" to a comma

Column 2,
Line 3, change "Complimentary" to -- Complementary --

Column 6,
Line 12, change "active" to -- activate --

Signed and Sealed this

Ninth Day of September, 2003

JAMES E. ROGAN
*Director of the United States Patent and Trademark Office*